United States Patent
Young et al.

(10) Patent No.: US 8,432,225 B2
(45) Date of Patent: Apr. 30, 2013

(54) AUTOMATIC GAIN CONTROL

(75) Inventors: Hubert Young, Colorado Springs, CO (US); Jeffrey Lee Lo, Sunnyvale, CA (US)

(73) Assignee: Fairchild Semiconductor, Inc., San Jose, CA (US)

( * ) Notice: Subject to any disclaimer, the term of this patent is extended or adjusted under 35 U.S.C. 154(b) by 128 days.

(21) Appl. No.: 12/899,829

(22) Filed: Oct. 7, 2010

(65) Prior Publication Data

US 2011/0080219 A1 Apr. 7, 2011

Related U.S. Application Data

(60) Provisional application No. 61/249,584, filed on Oct. 7, 2009.

(51) Int. Cl.
*H03G 3/10* (2006.01)

(52) U.S. Cl.
USPC ............................ 330/285; 330/296; 330/278

(58) Field of Classification Search .................. 330/285, 330/296, 278
See application file for complete search history.

(56) References Cited

U.S. PATENT DOCUMENTS

| | | | | |
|---|---|---|---|---|
| 6,166,598 | A * | 12/2000 | Schlueter | 330/127 |
| 6,178,313 | B1 * | 1/2001 | Mages et al. | 455/127.2 |
| 6,304,145 | B1 * | 10/2001 | Laureanti et al. | 330/285 |
| 6,853,242 | B2 * | 2/2005 | Melanson et al. | 330/10 |
| 6,998,919 | B2 * | 2/2006 | Gamero et al. | 330/289 |
| 7,106,137 | B2 * | 9/2006 | Dupuis et al. | 330/285 |
| 7,193,459 | B1 * | 3/2007 | Epperson et al. | 330/130 |
| 7,358,816 | B2 * | 4/2008 | Ryu et al. | 330/285 |
| 7,482,873 | B2 * | 1/2009 | Van Bezooijen et al. | 330/285 |
| 7,915,954 | B2 * | 3/2011 | Raghupathy et al. | 330/149 |
| 2010/0060358 | A1 * | 3/2010 | Nentwig | 330/199 |
| 2011/0234313 | A1 * | 9/2011 | Spies et al. | 330/127 |
| 2012/0049961 | A1 * | 3/2012 | Ripley et al. | 330/278 |

* cited by examiner

*Primary Examiner* — Patricia Nguyen
(74) *Attorney, Agent, or Firm* — Schwegman, Lundberg & Woessner, P.A.Fa

(57) ABSTRACT

This document discusses, among other things, a system and method for receiving an input signal and power supply information, and amplifying the input signal by a gain value determined as a function of the power supply information.

23 Claims, 5 Drawing Sheets

AUTOMATIC GAIN CONTROL

CLAIM OF PRIORITY

The present application claims the benefit of priority under 35 U.S.C. 119(e) of Young et al. U.S. Provisional Patent Application No. 61/249,584, entitled "AUTOMATIC GAIN CONTROL," filed Oct. 7, 2009, which is hereby incorporated by reference herein in its entirety.

BACKGROUND

Automatic gain control (AGC), generally, is a feature in electronic circuits that adjusts an amount of amplification as a function if an aspect of the signal being amplified. For example, as the amplitude of the input signal decreases, the amplification of the input signal increases, and as the amplitude of the input signal increases, the amplification of the input signal decreases.

OVERVIEW

This document discusses, among other things, a system and method for receiving an input signal and power supply information, and amplifying the input signal by a gain value determined as a function of the power supply information.

In Example 1, an apparatus includes an amplifier configured to receive a first signal at a first input and to provide an amplified signal at an output and a controller configured to receive power supply information and to adjust a gain of the amplifier using the power supply information.

In Example 2, the controller of Example 1 optionally includes an analog to digital converter (ADC) configured to receive the power supply information, to compare the power supply information to first and second limits, and to set the gain of the amplifier using the power supply information and the first and second limits.

In Example 3, the ADC of any one or more of Examples 1-2 is optionally configured to provide a digital gain setpoint using the power supply information, the first limit, and the second limit, and to set the gain of the amplifier using the digital gain setpoint, wherein the digital gain setpoint is a multi-bit value.

In Example 4, the controller of any one or more of Examples 1-3 is configured to adjust the gain a predetermined amount for each successive bit pattern of the multi-bit value.

In Example 5, the predetermined amount of any one or more of Examples 1-4 optionally includes a programmable predetermined amount.

In Example 6, the controller of any one or more of Examples 1-5 optionally includes a limit generator configured to provide the first and second limits based on a limit setpoint.

In Example 7, the limit setpoint of any one or more of Examples 1-6 optionally includes a programmable limit setpoint.

In Example 8, the limit generator of any one or more of Examples 1-7 is optionally configured to set the limit setpoint as a function of a value of a setpoint resistor coupled to the limit generator.

In Example 9, the limit generator of any one or more of Examples 1-8 optionally includes a voltage divider, the voltage divider including a first and second resistor coupled in series, wherein a first node of the first resistor is coupled to a first node of the second resistor, wherein a second node of the first resistor is configured to provide the first limit, and wherein a second node of the second resistor is configured to provide the second limit.

In Example 10, the limit generator of any one or more of Examples 1-9 optionally includes a setpoint comparator configured to compare a reference voltage and a setpoint voltage and to set a voltage at the first node of the first resistor using the comparison.

In Example 11, the setpoint voltage of any one or more of Examples 1-10 is optionally programmable using a setpoint resistor coupled to an input of the setpoint comparator.

In Example 12, the power supply information of any one or more of Examples 1-11 optionally includes voltage information indicative of the voltage of a battery coupled to the amplifier.

In Example 13, any one or more of Examples 1-12 optionally includes an integrated circuit die including the amplifier and the controller.

In Example 14, any one or more of Examples 1-13 optionally includes a setpoint resistor external to the integrated circuit, wherein the controller of any one or more of Examples 1-13 optionally includes a limit generator configured to provide the first and second limits based on a limit setpoint, and wherein the limit generator is optionally configured to set the limit setpoint as a function of the setpoint resistor.

In Example 15, the first signal of any one or more of Examples 1-14 optionally includes an audio signal.

In Example 16, a method includes receiving a first signal at a first input of an amplifier, providing an amplified signal at an output of the amplifier, receiving power supply information, and adjusting a gain of the amplifier using the received power supply information.

In Example 17, the adjusting the gain of the amplifier of any one or more of Examples 1-16 optionally includes comparing the power supply information to first and second limits, providing a digital gain setpoint using the comparison, decoding the digital gain setpoint, and setting set the gain of the amplifier using the decoded setpoint.

In Example 18, the comparing the power supply information to the first and second limits of any one or more of Examples 1-17 optionally includes detecting a resistance at an input of a limit generator and providing the first and second limits as a function of the detected resistance.

In Example 19, the providing the digital gain setpoint of any one or more of Examples 1-18 optionally includes providing a first digital gain setpoint value when the voltage information indicates that the battery voltage is above the first limit and providing a second digital gain setpoint value when the voltage information indicates that the battery voltage is below the second limit, wherein the first limit is optionally above the second limit.

In Example 20, the providing the digital gain setpoint of any one or more of Examples 1-19 optionally includes incrementing a value of the digital gain setpoint by a predetermined amount as the voltage information increases from the second limit to the first limit.

In Example 21, the receiving power supply information of any one or more of Examples 1-20 optionally includes receiving voltage information indicative of a battery voltage coupled to the amplifier.

In Example 22, any one or more of Examples 1-21 optionally includes an integrated circuit including an amplifier configured to receive a first signal at a first input and to provide an amplified signal at an output and a controller configured to receive power supply information and to adjust a gain of the amplifier using the power supply information, and a setpoint resistor, external to the integrated circuit, coupled to the controller. The controller of any one or more of Examples 1-21 optionally includes an analog to digital converter (ADC) configured to receive the power supply information, to compare the power supply information to first and second limits, and to set the gain of the amplifier using the power supply information and the first and second limits and a limit generator configured to provide the first and second limits using a setpoint voltage, wherein the setpoint voltage is optionally a function of the value of the setpoint resistor.

In Example 23, the ADC of any one or more of Examples 1-22 is optionally configured to provide a digital gain setpoint using the power supply information, the first limit, and the second limit, and to set the gain of the amplifier using the digital gain setpoint, wherein the digital gain setpoint is a multi-bit value.

In Example 24, the limit generator of any one or more of Examples 1-23 optionally includes a voltage divider including a first and second resistor coupled in series, wherein a first node of the first resistor is coupled to a first node of the second resistor, wherein a second node of the first resistor is configured to provide the first limit, and wherein a second node of the second resistor is configured to provide the second limit and a setpoint comparator configured to compare a reference voltage to the setpoint voltage and to set a voltage at the first node of the first resistor using the comparison.

In Example 25, of any one or more of Examples 1-24 optionally includes an audio output transducer configured to receive the amplified signal, wherein the first signal optionally includes an audio signal.

In Example 26, a system or apparatus can include, or can optionally be combined with any portion or combination of any portions of any one or more of Examples 1-25 to include, means for performing any one or more of the functions of Examples 1-25, or a machine-readable medium including instructions that, when performed by the machine, cause the machine to perform any one or more of the functions of Examples 1-25.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

The present inventors have recognized, among other things, that an automatic gain control (AGC) circuit can modulate gain as a function of a supply voltage. In an example, the supply voltage can include a battery voltage, such as in mobile electronic applications (e.g., mobile phone, media players, etc.) or one or more other supply voltages. In an example, as the supply voltage decreases, the gain of the AGC circuit can decrease (e.g., to save power). Such control can extend the useable interval of a device between power source replacement or power source re-charging, for example.

Figure 1:
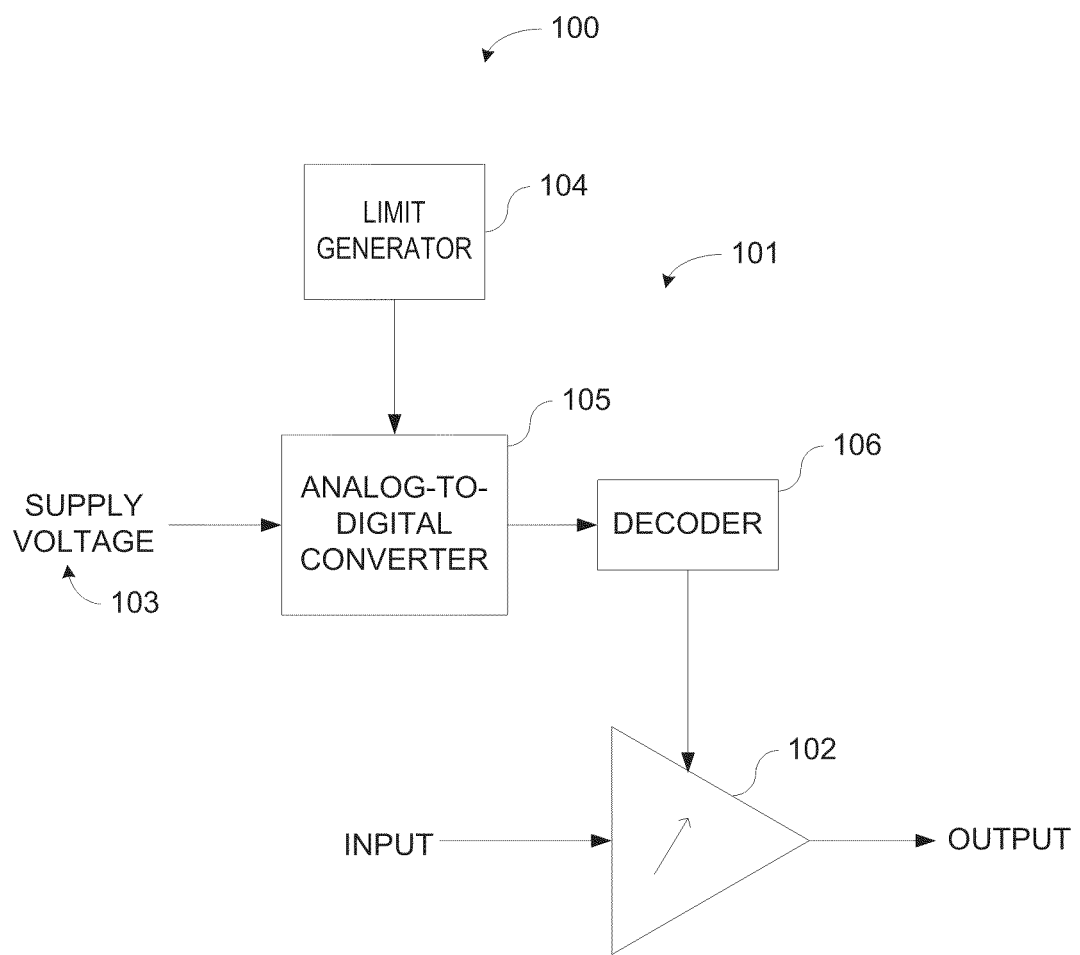
FIG. 1 illustrates generally an example of an amplifier circuit including an automatic gain control (AGC) circuit.

FIG. 1 illustrates generally an example of an amplifier circuit including an automatic gain control circuit. The amplifier circuit 100 includes an adjustable gain amplifier 102 and an AGC circuit 101 to adjust the gain of the amplifier 102 as a function of a supply voltage 103. The AGC circuit 101 includes a limit generator 104, an analog-to-digital converter (ADC) 105, and a decoder 106. The decoder 106 can decode an output of the ADC 105 and set the gain of the amplifier 102 corresponding to the output of the ADC 105. The ADC 105 can convert a representation of the supply voltage 103 into a digital representation. In an example, full-scale limits of the ADC 105 can correspond to an operating range of supply voltage in which the adjustable gain amplifier 102 gain adjustment can increase the useable life of the power supply. In an example, the full scale limits of the ADC 105 can be provided using the limit generator 104. In an example, the full scale limits of the ADC 105 can be provided using a limit setpoint. In an example, the limit setpoint is not user adjustable. In other examples, the limit setpoint can be programmable. In an example, the limit setpoint is user programmable, for example, by adjusting a setpoint resistor (not shown).

Figure 2:
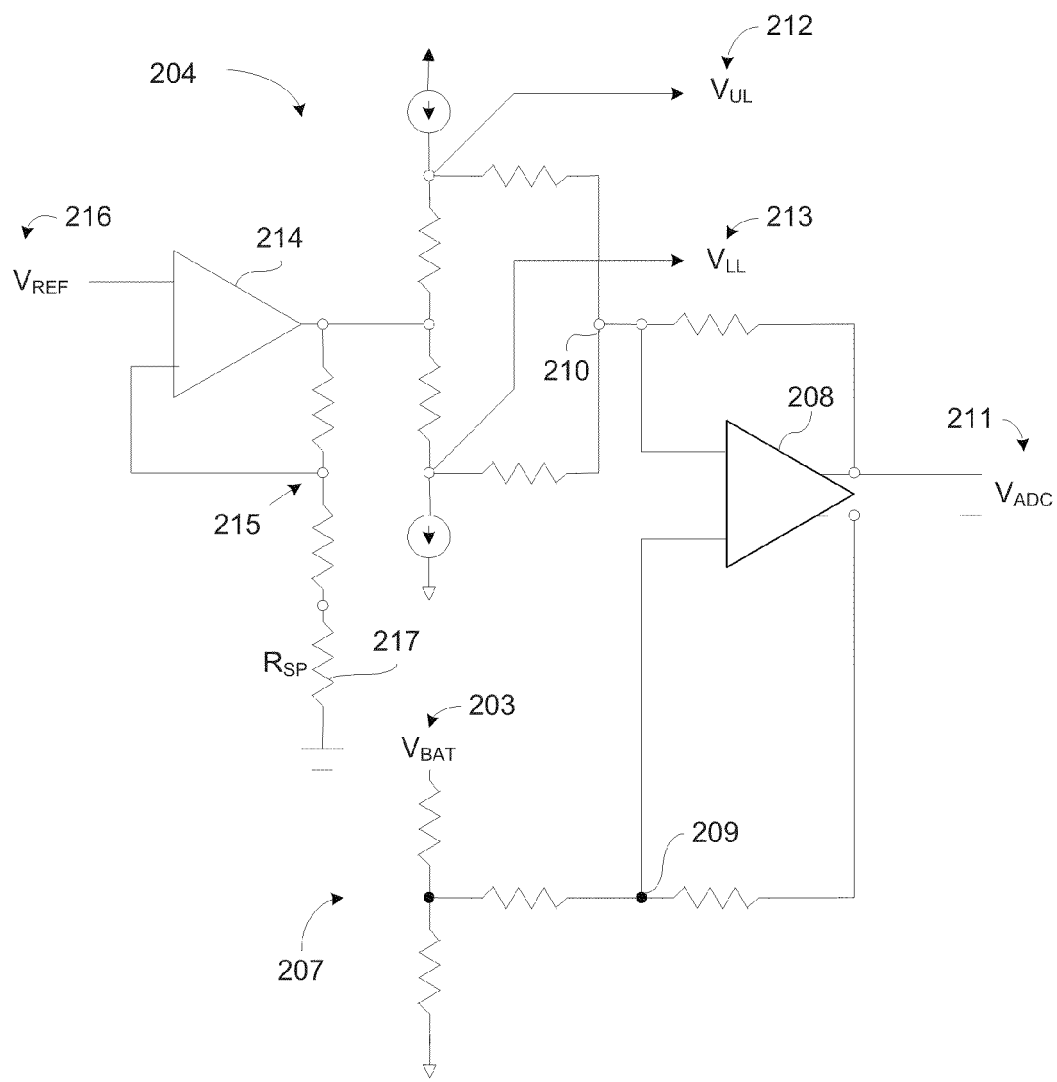
FIG. 2 illustrates generally an example of a portion of an AGC circuit according to an example of the present subject matter.

FIG. 2 illustrates generally an example of a portion of an AGC circuit according to an example of the present subject matter. An AGC circuit can include a limit generator 204 and a circuit 207 configured to scale a supply voltage 203, such as a battery voltage $V_{BAT}$. In an example, the AGC circuit can include a comparator amplifier 208 configured to compare a scaled supply voltage 209 to a trip set point 210. In an example, the trip set point 210 can be provided from the limit generator circuit 204. The output 211 of the comparator amplifier 208 can provide the analog input voltage $V_{ADC}$ for the ADC (not shown). The limit generator 204 can provide an upper limit voltage ($V_{UL}$) 212 and a lower limit voltage ($V_{LL}$) 213 for the ADC. The upper limit voltage 212 and the lower limit voltage 213 can define the full scale range of the ADC output. In various examples, at least one of the upper limit voltage 212, the lower limit voltage 213, or the trip setpoint 210 can be programmable. In an example, the upper limit voltage 212, the lower limit voltage 213, or the trip setpoint 210 can be generated using a setpoint amplifier 214 to sum a setpoint voltage 215 to a reference voltage ($V_{REF}$) 216. In some examples, at least one of the upper limit voltage 212, the lower limit voltage 213, or the trip setpoint 210 can be adjustable, for example, using a set point resistor ($R_{SP}$) 217 coupled to the setpoint amplifier 214.

In an example, the adjustable gain amplifier 102 and AGC circuit 101 of FIG. 1 are at least part of an integrated circuit die and the set point resistor 217 of FIG. 2 can be coupled to an external terminal of the integrated circuit die. In various examples, the adjustable gain amplifier 102 and AGC circuit 101 of FIG. 1 are implemented using software. In some examples the adjustable gain amplifier 102 and the AGC circuit 101 are implemented using hardware. In some examples, the adjustable gain amplifier 102 and the AGC circuit 101 can be implemented using a combination of hardware and software.

Figure 3:
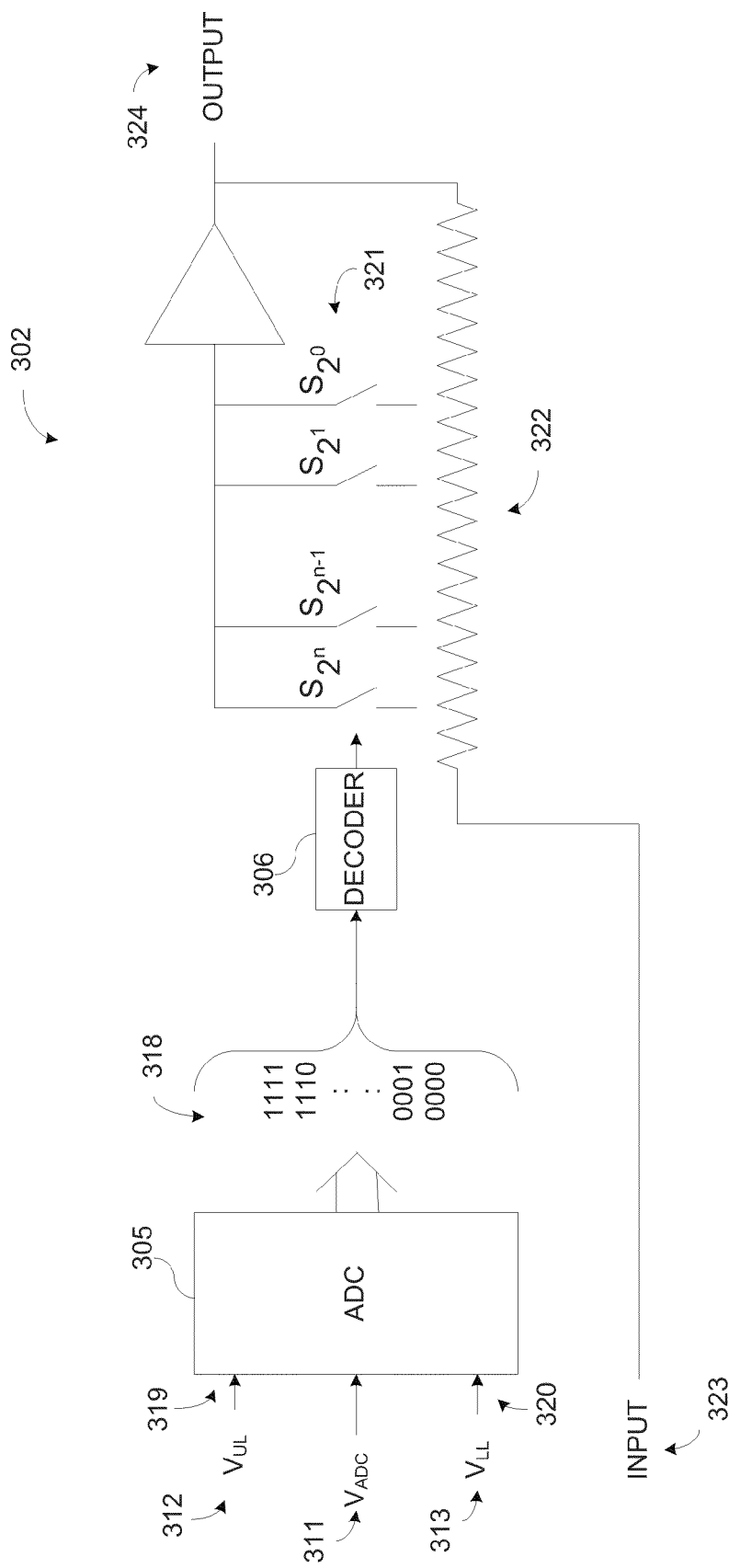
FIG. 3 illustrates generally an example of a portion of an AGC circuit and an adjustable amplifier 302 according to an example of the present subject matter.

FIG. 3 illustrates generally an example of a portion of an AGC circuit and an adjustable amplifier 302 according to an example of the present subject matter. In an example, an AGC circuit can include an analog-to-digital converter (ADC) 305 and a decoder 306. The ADC 305 can receive an input voltage ($V_{ADC}$) 311 to convert to a binary format 318. The ADC 305 can include a second input 319 for an upper voltage limit ($V_{UL}$) 312 and a third input 320 for a lower voltage limit ($V_{LL}$) 313. A range of the input voltage 311 corresponding to the range of the output binary format 318 can be established using the upper and lower voltage limits 312, 311. In an example, as the input voltage 311 becomes lower than the upper voltage limit 312, the output 318 of the ADC 305 can decrement to a binary bit pattern representing a lower gain. As the input voltage 311 becomes even lower, the ADC 305 can decrement to a bit pattern 318 representing an even lower gain. In the illustrated example, the output 318 of the ADC 305 ranges between a high value of 1111, to a low value of 0000. The high binary value (1111) can represent when the input voltage 311 to the ADC 305 is at or above the upper voltage limit 312. The low binary value can represent when the input voltage 311 to the ADC 305 is at or below the lower voltage limit 313. In an example, as the input voltage 311 passes below the lower limit 313, the device including the AGC circuit and the adjustable gain amplifier 302 can be disabled. It is understood that other ADC output binary patterns are possible without departing from the scope of the present subject matter, including but not limit to, binary coded decimal (BCD), twos-complement BCD, and twos-complement binary. It is understood that the output 318 of the ADC 305 can include more or less bits than the four bits shown in the example of FIG. 3 without departing from the scope of the present subject matter.

The decoder 306 can decode the output binary pattern 318 of the ADC 305 and set the gain of the adjustable amplifier 302 corresponding to the output bit pattern. In an example, the decoder 306 can control one or more switches ($S_2^n$, $S_2^{n-1}$, . . ., $S_2^1$, $S_2^0$) 321 to adjust an input and feedback resistance 322 of the adjustable amplifier 302 to, in turn, adjust the gain of the adjustable amplifier 302. In an example, the input 323 to the adjustable amplifier 302 can be an audio signal and the output 324 of the adjustable amplifier 302 can be coupled to an output audio transducer, such as a speaker or an earphone. In certain examples, the AGC circuit can be used to limit volume of an audio device as the voltage of a limited capacity voltage supply decays. Such control can extend the use of the audio device between replacement or re-charging of the limited capacity voltage supply.

In certain examples, the ADC architecture can be closely related to a successive-approximation-register (SAR) type architecture. The ADC can be chosen for small size, low power, and flexibility. In an example, an algorithmic ADC can recycle the hardware loop as bits are produced and accuracy does not depend on large well-matched devices.

Figure 4:
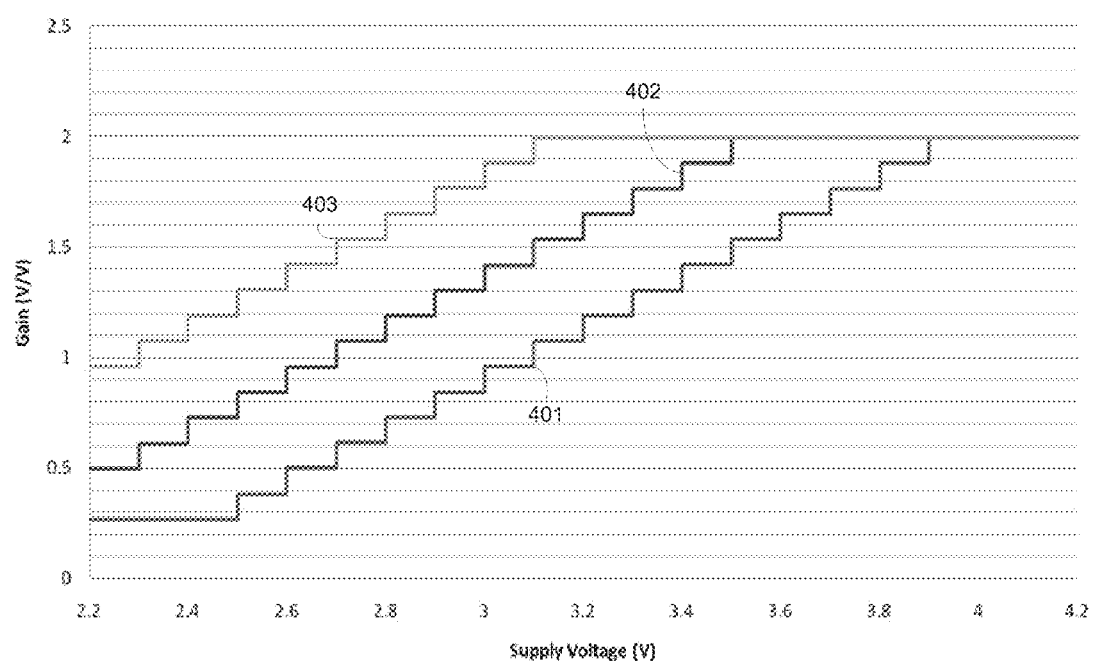
FIG. 4 illustrates generally an example of a relationship of an amplifier gain against supply voltage for an AGC circuit according to an example of the present subject matter.

FIG. 4 illustrates generally an example of a relationship of an amplifier gain against supply voltage for an AGC circuit according to an example of the present subject matter. FIG. 4 includes three plots illustrating three different AGC trip point settings. A first plot 401 illustrates a trip point set at 3.9 volts. A second plot 402 illustrates a trip point set at 3.5 volts. A third plot 403 illustrates a trip point set at 3.1 volts. In each plot, the ADC changes the gain as the supply voltage changes by approximately 0.11 volts. In various examples, other device circuitry may disable the device before the ADC progresses through the full range of binary output values. In is understood that other trip set points and other supply voltage change values are possible without departing from the scope of the present subject matter.

Figure 5:
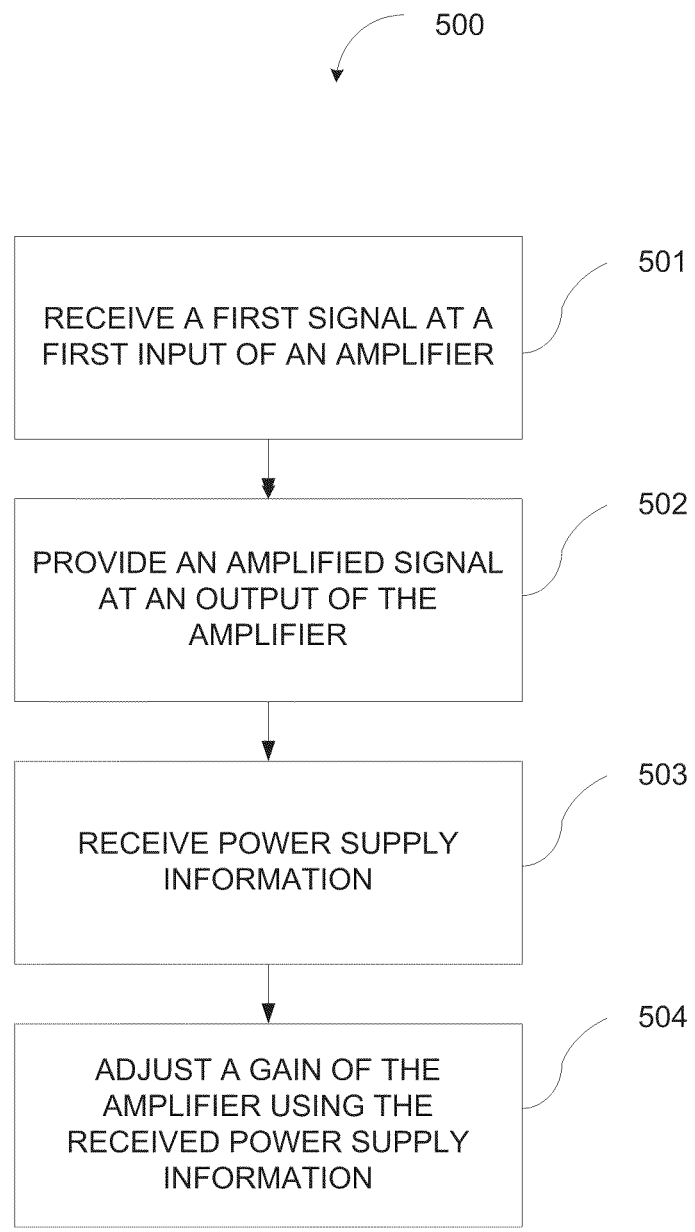
FIG. 5 illustrates generally an example of a method for operating an AGC circuit according to an example of the present subject matter.

FIG. 5 illustrates generally an example of a method for operating an automatic gain control (AGC) circuit according to an example of the present subject matter. At 501, a first signal can be received at a first input of an amplifier. At 502, an amplified signal can be provided at an output of the amplifier. At 503, power supply information can be received. And, at 504, a gain of the amplifier can be adjusted using the received power supply information.

Additional Notes

The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. In other examples, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. An apparatus comprising:
an amplifier configured to receive a first signal at a first input and to provide an amplified signal at an output; and
a controller configured to receive power supply information and to adjust a gain of the amplifier using the power supply information,
wherein the controller includes an analog to digital converter (ADC) configured to receive the power supply information, to compare the power supply information to first and second limits, and to set the gain of the amplifier using the power supply information and the first and second limits.

2. The apparatus of claim 1, wherein the ADC is configured to provide a digital gain setpoint using the power supply information, the first limit, and the second limit, and to set the gain of the amplifier using the digital gain setpoint, wherein the digital gain setpoint is a multi-bit value.

3. The apparatus of claim 2, wherein the controller is configured to adjust the gain a predetermined amount for each successive bit pattern of the multi-bit value.

4. The apparatus of claim 3, wherein the predetermined amount includes a programmable predetermined amount.

5. The apparatus of claim 1, wherein the controller includes a limit generator configured to provide the first and second limits based on a limit setpoint.

6. The apparatus of claim 5, wherein the limit setpoint includes a programmable limit setpoint.

7. The apparatus of claim 5, wherein the limit generator is configured to set the limit setpoint as a function of a value of a setpoint resistor coupled to the limit generator.

8. The apparatus of claim 5, wherein the limit generator includes a voltage divider, the voltage divider including a first and second resistor coupled in series, wherein a first node of the first resistor is coupled to a first node of the second resistor, wherein a second node of the first resistor is configured to provide the first limit, and wherein a second node of the second resistor is configured to provide the second limit.

9. The apparatus of claim 8, wherein the limit generator includes a setpoint comparator configured to compare a reference voltage and a setpoint voltage and to set a voltage at the first node of the first resistor using the comparison.

10. The apparatus of claim 9, wherein the setpoint voltage is programmable using a setpoint resistor coupled to an input of the setpoint comparator.

11. The apparatus of claim 10, wherein the power supply information includes voltage information indicative of the voltage of a battery coupled to the amplifier.

12. The apparatus of claim 1, including an integrated circuit die including the amplifier and the controller.

13. The apparatus of claim 12, including a setpoint resistor external to the integrated circuit;
wherein the controller includes a limit generator configured to provide the first and second limits based on a limit setpoint; and
wherein the limit generator is configured to set the limit setpoint as a function of the setpoint resistor.

14. The apparatus of claim 1, wherein the first signal includes an audio signal.

15. A method comprising:
receiving a first signal at a first input of an amplifier;
providing an amplified signal at an output of the amplifier;
receiving power supply information;
comparing the power supply information to first and second limits;
providing a digital gain setpoint using the comparison;
decoding the digital gain setpoint; and
setting set the gain of the amplifier using the decoded setpoint.

16. The method of claim 15, wherein the comparing the power supply information to the first and second limits includes:
detecting a resistance at an input of a limit generator; and
providing the first and second limits as a function of the detected resistance.

17. The method of claim 15, wherein the providing the digital gain setpoint includes:
providing a first digital gain setpoint value when the voltage information indicates that the battery voltage is above the first limit;
providing a second digital gain setpoint value when the voltage information indicates that the battery voltage is below the second limit; and
wherein the first limit is above the second limit.

18. The method of claim 17, wherein the providing the digital gain setpoint includes incrementing a value of the digital gain setpoint by a predetermined amount as the voltage information increases from the second limit to the first limit.

19. The method of claim 15, wherein the receiving power supply information includes receiving voltage information indicative of a battery voltage coupled to the amplifier.

20. A system comprising:
an integrated circuit including:
an amplifier configured to receive a first signal at a first input and to provide an amplified signal at an output; and
a controller configured to receive power supply information and to adjust a gain of the amplifier using the power supply information, the controller including:
an analog to digital converter (ADC) configured to receive the power supply information, to compare the power supply information to first and second limits, and to set the gain of the amplifier using the power supply information and the first and second limits; and
a limit generator configured to provide the first and second limits using a setpoint voltage;
a setpoint resistor, external to the integrated circuit, coupled to the controller; and
wherein the setpoint voltage is a function of the value of the setpoint resistor.

21. The system of claim 20, wherein the ADC is configured to provide a digital gain setpoint using the power supply information, the first limit, and the second limit, and to set the gain of the amplifier using the digital gain setpoint, wherein the digital gain setpoint is a multi-bit value.

22. The system of claim 20, wherein the limit generator includes:
a voltage divider including a first and second resistor coupled in series, wherein a first node of the first resistor is coupled to a first node of the second resistor, wherein a second node of the first resistor is configured to provide the first limit, and wherein a second node of the second resistor is configured to provide the second limit; and
a setpoint comparator configured to compare a reference voltage to the setpoint voltage and to set a voltage at the first node of the first resistor using the comparison.

23. The system of claim 20, including an audio output transducer configured to receive the amplified signal; and
wherein the first signal includes an audio signal.

* * * * *

UNITED STATES PATENT AND TRADEMARK OFFICE
CERTIFICATE OF CORRECTION

| | |
|---|---|
| PATENT NO. | : 8,432,225 B2 |
| APPLICATION NO. | : 12/899829 |
| DATED | : April 30, 2013 |
| INVENTOR(S) | : Hubert Young, III and Jeffrey Lee Lo |

Page 1 of 1

It is certified that error appears in the above-identified patent and that said Letters Patent is hereby corrected as shown below:

On the Title page, in column 1, Item (73) assignee, line 1, delete "Fairchild Semiconductor, Inc." and insert --Fairchild Semiconductor Corporation--, therefor Signed and Sealed this
Eighteenth Day of June, 2013

Teresa Stanek Rea
*Acting Director of the United States Patent and Trademark Office*